United States Patent [19]

Summerfelt

[11] Patent Number: 5,793,057
[45] Date of Patent: Aug. 11, 1998

[54] CONDUCTIVE AMORPHOUS-NITRIDE BARRIER LAYER FOR HIGH DIELECTRIC-CONSTANT MATERIAL ELECTRODES

[75] Inventor: Scott R. Summerfelt, Dallas, Tex.

[73] Assignee: Texas Instruments Incorporated, Dallas, Tex.

[21] Appl. No.: 472,621

[22] Filed: Jun. 7, 1995

Related U.S. Application Data

[62] Division of Ser. No. 283,441, Aug. 1, 1994, Pat. No. 5,585,300.
[51] Int. Cl.⁶ .......................... H01L 29/04; H01L 31/036; H01L 31/0376; H01L 3/20
[52] U.S. Cl. .......................... 257/55; 257/751; 257/764; 257/767
[58] Field of Search .......................... 257/751, 763, 257/768, 769, 760, 753, 52, 55, 767

[56] References Cited

U.S. PATENT DOCUMENTS 5,489,548  2/1996  Nishioka et al. .
5,504,041  4/1996  Summerfelt .
5,581,436  12/1996  Summerfelt et al. .
5,622,893  4/1997  Summerfelt et al. .

FOREIGN PATENT DOCUMENTS 0 404 295  12/1990  European Pat. Off. ........ H01L 29/92

*Primary Examiner*—Mahshid D. Saadat
*Assistant Examiner*—S. V. Clark
*Attorney, Agent, or Firm*—Brian A. Carlson; James C. Kesterson; Richard L. Donaldson

[57] ABSTRACT

A preferred embodiment of this invention comprises an oxidizable layer (e.g. TiN 50), an amorphous nitride barrier layer (e.g. Ti—Si—N 34) overlying the oxidizable layer, an oxygen stable layer (e.g. platinum 36) overlying the amorphous nitride layer, and a high-dielectric-constant material layer (e.g. barium strontium titanate 38) overlying the oxygen stable layer. The amorphous nitride barrier layer substantially inhibits diffusion of oxygen to the oxidizable layer, thus minimizing deleterious oxidation of the oxidizable layer.

14 Claims, 5 Drawing Sheets

CONDUCTIVE AMORPHOUS-NITRIDE BARRIER LAYER FOR HIGH DIELECTRIC-CONSTANT MATERIAL ELECTRODES

This is a divisional of application Ser. No. 08/283,441, filed Aug. 1, 1994, now U.S. Pat. No. 5,585,300.

CROSS-REFERENCES TO RELATED APPLICATIONS

The following related applications were filed concurrently with the instant application:

| Title | Inventors | Docket/ Serial Number |
|---|---|---|
| Improved High-Dielectric-Constant Material Electrodes Comprising Thin Platinum Layers | Summerfelt, Beratan, Kirlin, Gnade | TI-17950 |
| Improved Electrodes Comprising Conductive Perovskite-Seed Layers for Perovskite Dielectrics | Summerfelt, Beratan | TI-17952 |
| Improved High-Dielectric-Constant Material Electrodes Comprising Thin Ruthenium Dioxide Layers | Summerfelt, Beratan, Kirlin, Gnade | TI-19153 |
| Pre-oxidizing High-Dielectric-Constant Material Electrodes | Nishioka, Summerfelt, Park, Bhattacharya | TI-19189 |
| High-Dielectric-Constant Material Electrodes Comprising Sidewall Spacers | Nishia, Park, Bhattacharya, Summerfelt | TI-19272 |
| A Conductive Exotic-Nitride Barrier Layer for High-Dielectric-Constant Material Electrodes | Summerfelt | TI-19555 |
| A Conductive Noble-Metal-Insulator-Alloy Barrier Layer for High-Dielectric-Constant Material Electrodes | Summerfelt, Nicolet, Reid, Kolawa | TI-19556 |

The following previously filed applications are related to the instant application:

| Title | Inventors | Docket/ Serial Number |
|---|---|---|
| Improved Electrical Connections to Dielectric Materials | Gnade, Summerfelt | 08/009,521 |
| Improved Electrical Connections to Dielectric Materials | Gnade, Summerfelt | 08/260,149 |
| Lightly Donor Doped Electrodes for High-Dielectric-Constant Materials | Summerfelt, Beratan, Gnade | 08/040,946 |
| Lightly Donor Doped Electrodes for High-Dielectric-Constant Materials | Summerfelt, Beratan, Gnade | TI-17660.1 |
| Improved Electrode Interface for High-Dielectric-Constant Materials | Summerfelt, Beratan | 08/041,025 |

FIELD OF THE INVENTION

This invention generally relates to improving electrical connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, ferroelectric, or high-dielectric-constant (hereafter abbreviated HDC) materials such as $(Ba,Sr)TiO_3$ (BST) usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high-dielectric-constant materials.

SUMMARY OF THE INVENTION

As used herein, the term "high-dielectric-constant" (hereafter abbreviated HDC) means a dielectric constant greater than about 50 at device operating temperature. HDC materials are useful for the fabrication of many electrical devices, such as capacitors. However, HDC materials are generally not chemically stable when deposited directly on a semiconductor substrate, so one or more additional layers are required to provide the electrical connection between the HDC material and the substrate. The additional layer or layers should generally be chemically stable when in contact with the substrate and also when in contact with the high-dielectric-constant material. Additionally, due to unit area constraints, high density devices (e.g. 256 Mbit and 1 Gbit DRAMs) generally require a structure in which the lower electrode is conductive from the HDC material down to the substrate. The deposition of an HDC material usually occurs at high temperature (generally greater than about 500° C.) in an oxygen containing atmosphere. An initial electrode structure formed prior to this deposition should be stable both during and after this deposition, while subsequent electrode structures formed after this deposition need only be stable after this deposition.

There are several problems with the materials thus far chosen for the electrodes in standard thin-film (herein defined as generally less than 5 microns (um)) applications. For example, although Pt is unreactive with respect to the HDC material, it has been found that it is difficult to use Pt alone as an initial electrode. Pt generally allows oxygen to diffuse through it and hence typically allows neighboring materials to oxidize. In addition, Pt also does not normally stick very well to traditional dielectrics such as $SiO_2$ or $Si_3N_4$, and Pt can rapidly form a silicide at low temperatures. Thus a Ta or TiN layer has been suggested as an adhesion layer under the Pt electrode. However during BST deposition or annealing, oxygen can possibly diffuse through the Pt and oxidize the adhesion layer and make the adhesion layer less conductive. Further, the substrate (e.g. silicon) itself can become undesirably oxidized during the deposition of the HDC material.

Conductive oxides such as $RuO_2$ generally also exhibit problems in standard thin-film structures. For example, the electrical properties of the structures formed using these oxides are usually inferior to those formed using e.g. Pt. Many thin-film applications require a small leakage-current-density in addition to a large capacitance per unit area. The leakage current is sensitive to many variables such as thickness, microstructure, electrodes, electrode geometry and composition. For example, the leakage current of lead zirconium titanate (PZT) using $RuO_2$ electrodes is several orders of magnitude larger than the leakage current of PZT using Pt electrodes. In particular, it appears that the leakage current is controlled by Schottky barriers, and that the smaller leakage current with Pt electrodes appears to be due to the larger work function.

Other structures which have been proposed for standard thin-film structures include alloys of Pt, Pd, Rh as the electrode and oxides made of Re, Os, Rh and Ir as a sticking layer on single crystal Si or poly-Si. A problem with these electrodes is that these oxides are usually not stable next to Si and that these metals typically rapidly form silicides at low temperatures (generally less than about 450° C.). If other associated problems can be avoided or minimized, this type of electrode structure should retain its conductivity even after the deposition of the HDC material if an appropriate barrier layer(s) is used between the conductive oxide and the Si substrate.

Generally, the instant invention provides a barrier layer comprising novel materials for use in an HDC material electrode. For a lower electrode formed prior to HDC material deposition, the barrier layer is generally located between an overlying oxygen stable layer (contacting the HDC material) and an underlying oxidizable layer(s). As used herein, the term "barrier", when used in reference to a layer between an oxygen stable layer and an oxidizable layer, means a conductive layer which minimizes diffusion of oxygen (through itself) down to the oxidizable layer, thus minimizing oxidation (and degradation) of the oxidizable layer.

As used herein, the term "oxygen stable", when used in reference to a layer contacting an HDC material, means a layer which provides a stable conductive interface to the HDC material during and after HDC processing (e.g. after being exposed to high temperature oxidizing conditions). Note that when a conductive oxide such as $RuO_2$ is used for the oxygen stable layer (or another part of the electrode), that layer can also contain unoxidized or partially oxidized Ru. For example, an oxygen stable layer of Ru which is chemically changed by becoming partially or fully oxidized during the HDC deposition process is still considered oxygen stable since it still provides a stable conductive interface to the HDC material.

As used herein, the term "oxidizable", when used in reference to a layer underlying the barrier layer, means a conductive layer which is generally used to make electrical connection to or in the substrate, and which generally becomes more insulating when oxidized.

Desirable properties of the barrier layer include the following: 1) it generally remains conductive after deposition and/or annealing of HDC material; 2) it generally maintains low contact resistance between the overlying oxygen stable layer and the underlying oxidizable conductive layer; 3) it generally does not react with the oxygen stable layer and possibly degrade the HDC material; 4) it generally substantially prevents diffusion of oxygen from the overlying oxygen stable layer to the underlying conductive layer; 5) it generally maintains a stable morphology; and 6) it generally is manufacturable (e.g. reasonable cost and yield).

The disclosed structures generally provide electrical connection to HDC materials without the disadvantages of prior art structures. One embodiment of this invention comprises an oxidizable layer, a barrier layer overlying the oxidizable layer, an oxygen stable layer overlying the barrier layer, and a layer of a high-dielectric-constant material overlying the oxygen stable layer.

A method of forming an embodiment of the present invention comprises forming an oxidizable layer, forming a barrier layer on the oxidizable layer, forming an oxygen stable layer on the barrier layer, and forming a layer of a high-dielectric-constant material on the oxygen stable layer. The barrier layer substantially inhibits diffusion of oxygen to the oxidizable layer, and the oxidizable layer is substantially unoxidized.

These are apparently the first microelectronic structures wherein a barrier layer comprising novel oxygen barrier materials is used to provide electrical connection between an underlying oxidizable layer and an overlying oxygen stable layer contacting a high-dielectric-constant material. These structures may also be used for multilayer capacitors and other thin-film devices such as pyroelectric materials (e.g. (uncooled) infrared detectors), non-volatile ferroelectric RAMs (using permanent polarization properties), thin-film piezoelectric and thin-film electro-optic devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
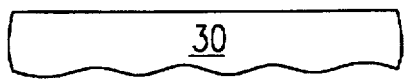
FIGS. 1–5 are cross-sectional views of a microelectronic structure showing the progressive steps in the fabrication of an HDC material electrode comprising a barrier layer.

The following sections provide various alternate schemes for the barrier layer.

Amorphous Nitride Barrier Layers

In a first preferred embodiment, a ternary or greater amorphous nitride layer is used for the barrier layer. These are apparently the first structures wherein a barrier layer for an HDC material comprises a ternary or greater amorphous nitride layer. The amorphous nitride layer generally oxidizes very slowly compared with standard semiconductor processing materials such as TiN and hence the conductivity through the amorphous nitride layer underneath the oxygen stable layer generally remains conductive even after exposure to oxygen at high temperatures, such as during the deposition of the HDC material. For example, the oxidation rate of a Ta—Si—N barrier layer is generally very slow compared to standard materials such as TiN, which may be due to the fact that the oxidation rate of $Si_3N_4$ is relatively very slow.

This type of material has generally been shown to be a better barrier layer than standard barrier materials for common metals, including noble metals. See Pokela, et al., "Amorphous Ternary Ta—Si—N Diffusion Barrier Between Si and Au", *J of Electrochemical Society*, 138, pp. 2125–2129, 1991. However the present invention is apparently the first to use a ternary or greater amorphous nitride material as an oxygen barrier in the lower electrode of an HDC material.

Many different barrier material combinations have been proposed in order to solve the problems described hereinabove for lower electrodes for HDC materials. Despite extensive research in this area with numerous papers having been published, the ternary or greater amorphous nitride layer of the instant invention has apparently heretofore never been taught or suggested as a possible oxygen barrier layer for HDC material electrodes.

Exotic Nitride Barrier Layers

In another preferred embodiment, an exotic nitride layer is used for the barrier layer. As used herein, exotic nitrides are nitrides that are generally not used in standard semiconductor processing, and are defined more specifically in the Table hereinbelow. These are apparently the first structures wherein a barrier layer for an HDC material comprises an exotic nitride layer underlying an oxygen stable layer. The exotic nitride layer generally oxidizes very slowly compared with standard semiconductor processing materials such as TiN and hence the conductivity through the exotic nitride layer underneath the oxygen stable layer generally remains conductive even after exposure to oxygen at high temperatures, such as during the deposition of the HDC material. For example, the oxidation rate for exotic nitrides such as ZrN and HfN is generally much slower than for standard materials such as TiN.

ZrN and HfN have been investigated as barrier layers for metals such as Pt, Cu, Au and Al. ZrN and HfN have also been investigated for contacting PZT and Y—Ba—Cu—O. See Parikh, et al., "Study of Diffusion Barriers for PZT Deposited on Si for Non-Volatile Random-Access Memory Technology", *Materials Research Society Proceedings*, 200, pp. 193–198, 1990. However, even though these exotic nitrides will oxidize slowly, they do generally oxidize as discussed hereinbefore. A layer in contact with the HDC material generally cannot form even a monolayer of a low dielectric constant material next to the HDC layer without substantially degrading electrical contact at that point. The present invention is apparently the first to use an exotic nitride material as an oxygen barrier underlying an oxygen stable layer in the lower electrode of an HDC material.

Oxidation of the barrier layer itself may cause problems. One possible problem is an increase in the contact resistance between the oxidizable layer and the oxygen stable layer. This is generally not as critical as the oxygen stable layer next to the HDC material remaining conductive. Another possible problem is that the most common oxygen stable layer (Pt) easily forms hillocks in response to compressive stress. Oxidation of the barrier layer can result in a large expansion in the barrier layer as it is converted e.g. from a nitride to an oxide. For example, with a standard material such as TiN, the ratio of final $TiO_2$ thickness/initial TiN thickness is about 1.58. The ratios for several other nitrides and their oxides are generally as follows (wherein t represents thickness): $t(Ta_2O_5)/t(TaN)=2.3$, $t(Y_2O_3)/t(YN)=1.2$, $t(ZrO_2)/t(ZrN)=1.48$, $t(Al_2O_3)/t(AlN)=1.02$, $t(CaO)/t(Ca_3N_2)=0.90$. A typical trend is for materials which have a large oxidation state such as $Ta^{+5}$ to generally expand the most and for materials with a lower oxidation state such as $Ca^{+2}$ to generally expand the least or even contract. Therefore, some materials such as TaN are generally not as useful because of the large volume expansion for oxidation.

One possible disadvantage in using exotic nitride materials is generally the newness of most of these materials in a standard semiconductor fab. Acceptance of new materials into a semiconductor fab can possibly be a substantial hurdle to overcome. One possible combination which might not have these problems is combinations of AlN. Stoichiometric AlN is insulating, but doped AlN is generally conductive. Doping can be performed by depositing N deficient AlN or by adding cationic dopants such as TiN or GaN or anionic dopants such as B or C. All of the these combinations should generally be acceptable for use semiconductor fabs.

As an example, the oxidation rate of (Ti,Al)N has been measured to be more than two orders of magnitude slower than the oxidation rate of TiN.

Acceptance of other exotic nitrides such as ZrN and HfN may actually not be very difficult. First, these materials are very similar chemically to Ti and hence basic processing recipes such as reactive deposition and etching will generally require very minor modification. Also, they have low vapor pressures and behave similarly to Ti next to Si and $SiO_2$ are generally not as poisonous as some accepted materials such as Au or Cu. Finally, these materials have already seen previous use as barrier layers (but for different purposes) and hence they are generally not complete unknowns.

Many different barrier material combinations have been proposed in order to solve the problems described hereinabove for lower electrodes for HDC materials. Despite the possible advantages of an exotic nitride layer, and despite extensive research in this area with numerous papers having been published, the exotic nitride layer of the instant invention has apparently heretofore never been taught or suggested as a possible oxygen barrier layer underlying an oxygen stable layer for HDC material electrodes.

Noble-Metal-Insulator-Alloy Barrier Layers

In yet another preferred embodiment, a noble-metal-insulator-alloy layer is used for the barrier layer. These are apparently the first structures wherein a barrier layer for an HDC material comprises a noble-metal-insulator-alloy layer. The noble metal component generally remains conductive even after exposure to oxygen directly or by diffusion through the overlying oxygen stable layer, while the insulator component generally acts as a chemical barrier between the oxidizable layer and the oxygen stable layer.

These films may be viewed as small particles of the noble metal in a dielectric matrix. For example, Pd—Si—O can be thought of as very small Pd particles in a $SiO_2$ matrix. Generally, by controlling the relative size of the noble metal particle and the composition of the layer, it is possible to control the thickness of the dielectric. A small enough thickness (e.g. 5–20 A thick) will generally result in very good barrier properties yet allow current passage by tunneling through the dielectric matrix via the noble metal particles. Because these materials are only used as a barrier layer which is not the primary contact to the HDC material, their resistivity does not need to be exceptionally low, and hence the degraded conductivity compared to a pure noble metal layer is generally not a problem.

However, too much noble metal and/or too high of a deposition temperature will generally result in interconnected metal particles and very poor oxygen barrier properties. Also, the chemical barrier properties of these materials will generally be controlled by the dielectric layer, and an amorphous matrix will generally result in better barrier properties. (A polycrystalline material will generally allow diffusion via the grain boundaries.)

By using a noble metal such as Pt (or Ru, which has a conductive oxide), the barrier layer generally remains conductive even after exposure to oxygen at high temperatures, such as during the deposition of the HDC material. Generally, dielectric materials that are exceptional in their barrier properties are selected for the insulator material (e.g. $SiO_2$, $Si_3N_4$, $B_2O_3$, AlN, $Al_2O_3$). The insulator materials are generally also either stable in oxygen by already being oxides or oxidize at an extremely slow rate with a small volume expansion during oxidation and hence generally do not stress the overlying oxygen stable layer. It is also possible to combine various dielectrics and noble metals in order to tailor the barrier layer to a particular application. For example, an $SiO_2$ dielectric is more stable to oxidation compared to $Si_3N_4$, but $SiO_2$ is a poorer barrier to Pb migration when using a $Pb(Zr,Ti)O_3$ HDC layer compared to $Si_3N_4$.

Specific Methods/Structures

Figure 2:
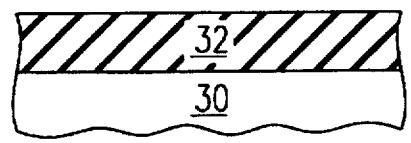

With reference to FIGS. 1–5, there is shown a method of forming a preferred embodiment of this invention, a microelectronic structure comprising a high-dielectric-constant material and lower electrode having a novel barrier layer. FIG. 1 illustrates a silicon semiconductor substrate 30. FIG. 2 illustrates an $SiO_2$ insulating layer 32 formed on the surface of the silicon substrate 30. $SiO_2$ layer 32 may or may not be capped with a diffusion barrier such as $TiO_2$ or $Si_3N_4$. An oxidizable plug which is typically formed in the $SiO_2$ layer 32 for connection of the barrier layer to the substrate will be described in following embodiment.

Figure 3:
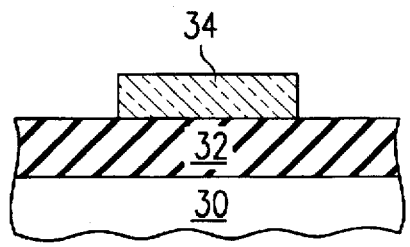

Embodiments comprising an amorphous nitride barrier: FIG. 3 illustrates a barrier layer 34 formed on $SiO_2$ layer 32. An amorphous nitride layer can be used for barrier layer 34. Specifically, 100 nm of Ti—Si—N is reactively RF sputtered using a titanium silicide ($Ti_2Si$) target in a $N_2$+Ar (10:90) ambient at ~10 mTorr with the substrate not heated (near room temperature). Barrier layer 34 is then dry etched in a low-pressure, high-density plasma reactive ion etch (RIE) reactor.

Embodiments comprising an exotic nitride barrier: Alternatively, an exotic nitride could be used for barrier layer 34. Specifically, 100 nm of ZrN is reactively RF sputtered using a Zr metal target in a $N_2$+Ar (10:90) ambient at ~10 mTorr with the substrate at 300° C. As another exotic nitride example, 100 nm of Ti—Al—N is reactively RF sputtered using a titanium aluminide target (TiAl) in a $N_2$+Ar (5:95) ambient at ~10 mTorr with the substrate held near 100° C.

Embodiments comprising a noble-metal-insulator-alloy barrier: Alternatively, a noble-metal-insulator-alloy could be used for barrier layer 34. Specifically, 100 nm of Pd—Si—N is reactively RF sputtered using a palladium silicide (PdSi) target in a $N_2$+Ar (10–90) ambient at ~10 mTorr with the substrate not heated (near room temperature). As another noble-metal-insulator-alloy example, 100 nm of Pd—Si—O is reactively RF sputtered using a palladium silicide (PdSi) target in a $O_2$+Ar (5–95) ambient at ~10 mTorr with the substrate not heated (near room temperature).

Figure 4:
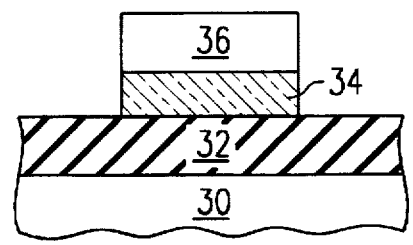

FIG. 4 illustrates a platinum layer 36 formed on barrier layer 34. Specifically, 200 nm of Pt is DC sputter deposited in an Ar atmosphere at ~5 mTorr using a Pt target with the substrate temperature held at 325° C. Pt layer 36 can also be deposited using e-beam evaporation, CVD, or metal organic CVD (MOCVD). The microstructure and thermal stress of the Pt layer 36 is generally improved by depositing at elevated temperatures (300° C. to 600° C.). Alternatively, Ru can be deposited and partially or completely converted either during or after the deposition to $RuO_2$ at the current process step or during subsequent processing steps.

The height of Pt layer 36 can vary depending on the desired capacitance density of the HDC material, the total desired capacitance, and the generation of the device. For example, future devices such as 1 G DRAMs may generally require taller capacitors to provide more electrode surface area/unit area as compared to 256M DRAM devices, since 1 G DRAMs will generally need to provide more capacitance/unit area (due to e.g. increased functionality and shrinking device features). After deposition of Pt layer 36, photoresist is deposited and patterned. Pt layer 36 is then dry etched in a low-pressure, high-density plasma RIE reactor.

The structure is then prepared for the deposition of the high dielectric constant material. This is done since the oxidation rate of barrier layer 34 is generally much more rapid at the beginning of the HDC deposition process then later. It is therefore beneficial to perform partial oxidation in order let the structure react to less strenuous oxidizing conditions before HDC deposition. For example, if the metal-organic chemical vapor deposition (MOCVD) of the HDC material occurs at 650° C. in 1 Torr $O_2$ for 3 minutes, then the structure should be annealed at 600° C. for 20 minutes in 1 Torr $O_2$ before HDC deposition. The lower temperature generally has some advantage in that it slows the oxidation rate down and allows Pt layer 36 more time to relax than if the oxidation is performed at full deposition temperature. Another benefit of this oxidation anneal process is that Pt layer 36 can rearrange to further round any corners after being etching. This oxidation anneal can also be used with Ru as oxygen stable layer 36 to form an $RuO_2$ shell. Similarly, after subsequent process steps, a capacitor structure with both lower and upper electrodes can be annealed to improve the capacitor properties.

Figure 5:
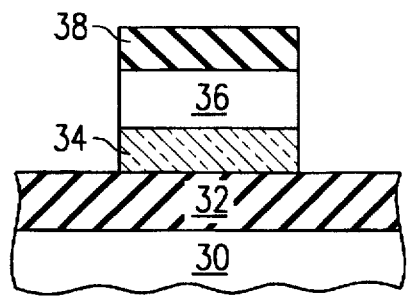

As described hereinabove, BST layer 38 is deposited by MOCVD techniques on Pt layer 36 to form the structure shown in FIG. 5. The deposition of BST layer 38 generally requires very oxidizing conditions, however Pt layer 36 will remain unoxidized, and barrier layer 34 will substantially inhibit oxygen from diffusing down to underlying materials.

Figure 6:
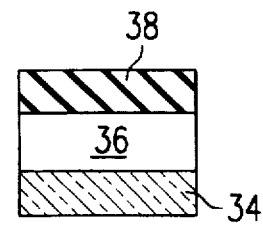
FIG. 6 is a cross-sectional view of an HDC material electrode comprising a barrier layer.

In an alternate embodiment, FIG. 6 illustrates a barrier layer 34, an oxygen stable layer of platinum 36 deposited on barrier layer 34, and a layer of high-dielectric-constant barium strontium titanate (BST) 38, deposited on Pt layer 36.

Figure 7:
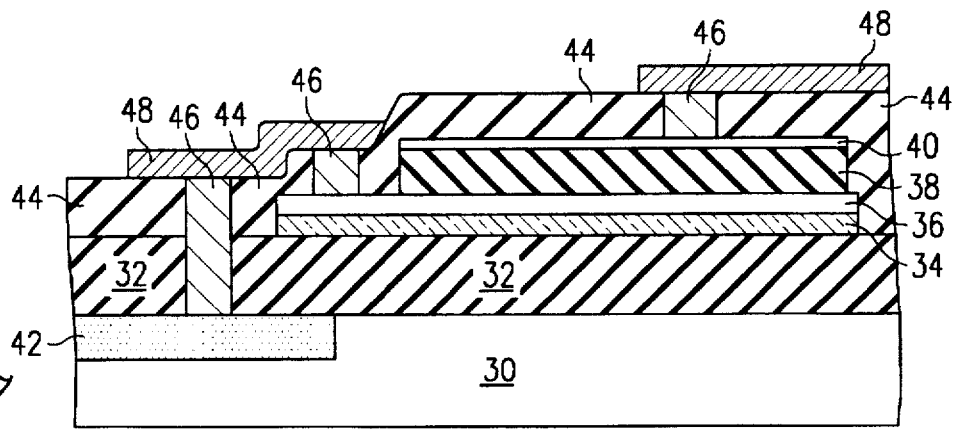
FIGS. 7–9 are cross-sectional views of various HDC material capacitor structures with lower electrodes comprising barrier layers.
Figure 8:
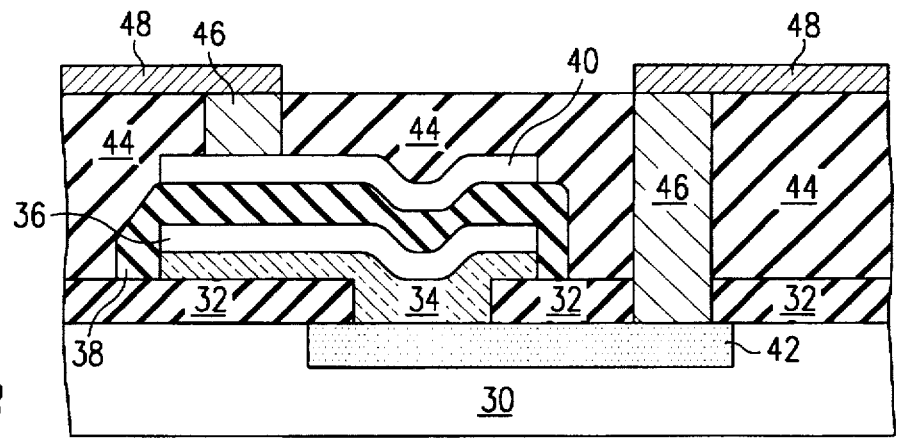
Figure 9:
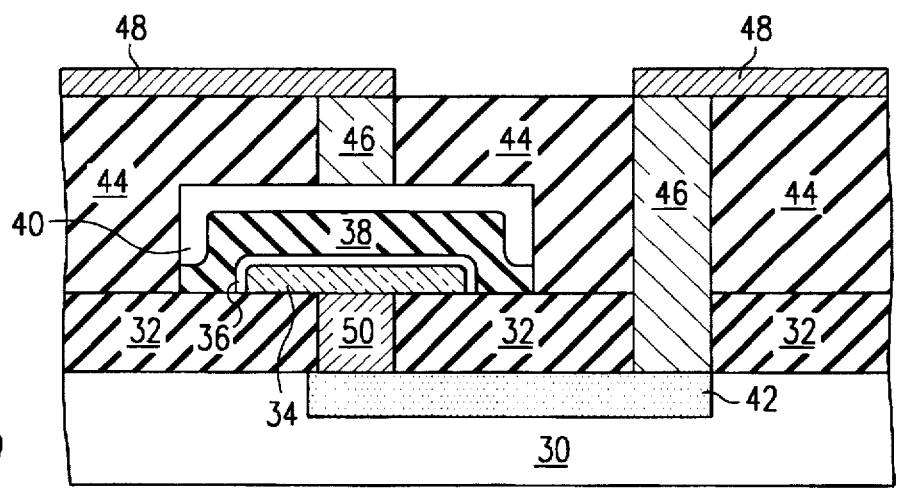

With reference to FIGS. 7–9, there are shown three alternate embodiments for various capacitor structures. The structures of FIGS. 8 and 9 can be used for capacitors which are substantially planar as shown, or for capacitors with high aspect ratios, wherein the sides of the electrodes contribute substantially to the total surface area of the electrodes in contact with the HDC material.

With reference to FIG. 7, there is illustrated a high-dielectric-constant capacitor utilizing a lower electrode comprising a barrier layer. Basically the structure of FIG. 5 is used, however in this embodiment the barrier layer 34 is not used for direct electrical connection since electrical contact is made directly to Pt layer 36 from above, via a conductive MN plug 46. The TiN plug 46 makes electrical contact to the aluminum top metallization 48 through the second SiO$_2$ insulating layer 44. The two other TiN plugs 46 make electrical contact from the aluminum top metallization layer 48 to the Pt upper electrode 40 and to the doped silicon region 42. The lower electrode in FIG. 7 is generally suitable only for low density devices since there is no direct path from the lower electrode to the substrate. Therefore, in this embodiment, barrier layer 34 does not need to be conductive after deposition of BST layer 38.

Barrier layer 34 does need to remain conductive in FIGS. 8–9. Also, in these figures barrier layer 34 is directly exposed to the oxidizing conditions present during the deposition of BST layer 38 on the sides not covered by the oxygen stable layer. Many materials such as TiN oxidize rapidly under direct exposure to the HDC material deposition process. To alleviate this problem, Pt layer 36 could be formed on the sides of barrier layer 34 as well as on the top.

With reference to FIG. 8, there is illustrated a high-dielectric-constant capacitor utilizing a lower electrode comprising a barrier layer. The basic capacitor structure of FIG. 7 is used, however in this embodiment barrier layer 34 provides electrical connection to and diffusion protection for oxidizable doped silicon region 42.

With reference to FIG. 9, there is again illustrated a high-dielectric-constant capacitor utilizing a lower electrode comprising a barrier layer. The basic capacitor structure of FIG. 8 is used, however in this embodiment barrier layer 34 provides electrical connection to and diffusion protection for oxidizable TiN/TiSi$_2$/poly-silicon plug 50. Using a standard process, 10 nm of Ti is sputter deposited on poly-Si followed by an N$_2$ rapid thermal anneal (700° C. for 30 seconds) or NH$_3$ furnace anneal (575° C. for 10 minutes) to form a TiN/TiSi$_2$/poly-Si structure. Excess TiN is then selectively removed chemically using peroxide.

In an alternate method, a vapor HF clean of a poly-Si layer is performed immediately prior to the deposition of a TiN layer, without using a TiSi$_2$ layer. It is beneficial that the structure not be exposed to a contaminating environment, such as the atmosphere, between the HF clean and the adhesion layer deposition process steps, in order to ensure good adhesion between the poly-Si and the TiN layer.

In an alternate structure, barrier layer 34 in FIG. 9 could extend down into SiO$_2$ layer 32 to form the plug itself or a portion thereof.

Figure 10:
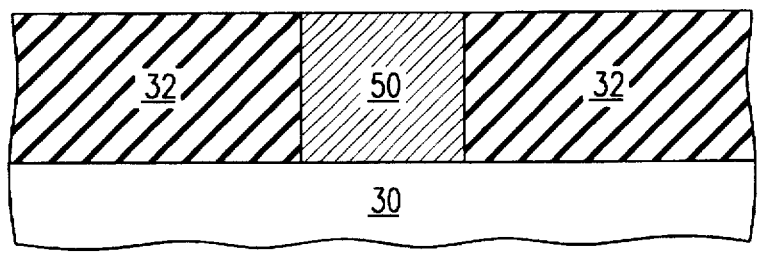
FIGS. 10–15 are cross-sectional views of a microelectronic structure showing the progressive steps in the fabrication of an HDC material capacitor with a lower electrode comprising a barrier layer.
Figure 11:
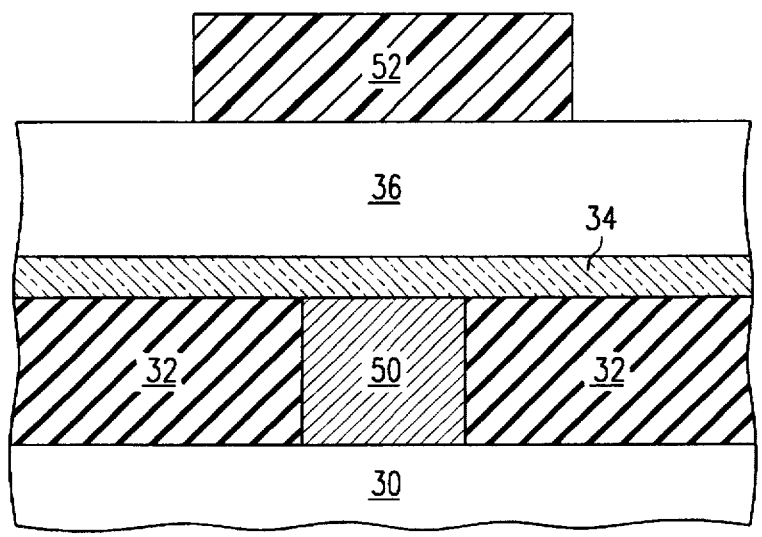
Figure 12:
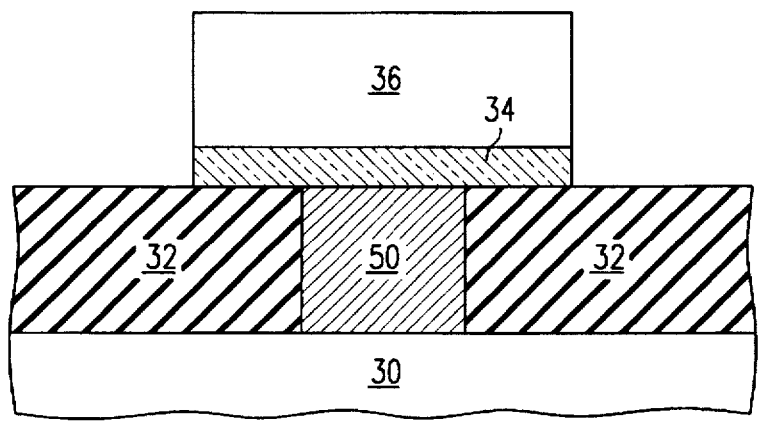

With reference to FIGS. 10–15, there is shown a method of forming another embodiment of this invention, an HDC material capacitor comprising a lower electrode with novel barrier materials. FIGS. 10–15 more clearly illustrate the effects of pre-oxidizing and annealing of the structure prior to the HDC material deposition. FIG. 10 illustrates a silicon semiconductor substrate 30, with an SiO$_2$ insulating layer 32 formed thereon. A TiN plug 50 has been formed in SiO$_2$ layer 32. FIG. 11 illustrates an unpatterned barrier layer 34 deposited on the SiO$_2$ layer 32 directly over the TiN plug 52. An unpatterned Pt layer 36 is deposited on barrier layer 34. Finally, FIG. 11 illustrates a layer of photoresist 52 that has been deposited and patterned on Pt layer 36 to form a mask for etching Pt layer 36 and barrier layer 34. FIG. 12 illustrates the structure after Pt layer 36 and barrier layer 34 have been etched, and photoresist 52 has been removed.

Figure 13:
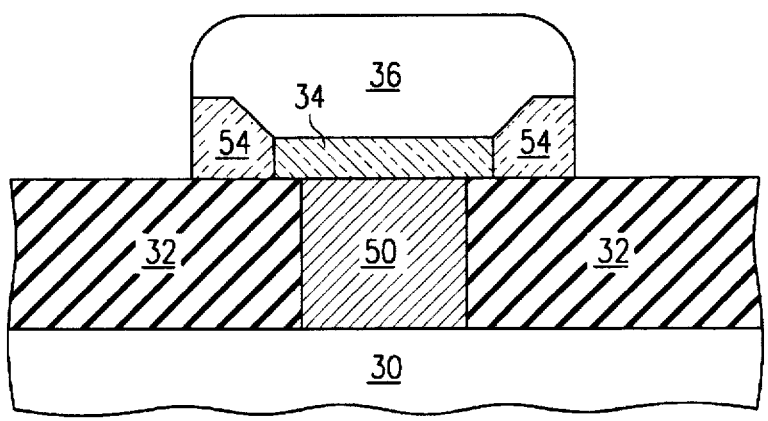

FIG. 13 illustrates the structure after partial pre-oxidation has formed oxidized sidewall 54 of barrier layer 34. Note that some barrier layer materials such as Pd—Si—O are already oxidized and will not form pre-oxidized sidewall 54. In the anneal process Pt layer 36 has rearranged to further round any corners after being etching. Sharp corners can cause excess leakage current, or possibly cracking in the BST layer 38.

Figure 14:
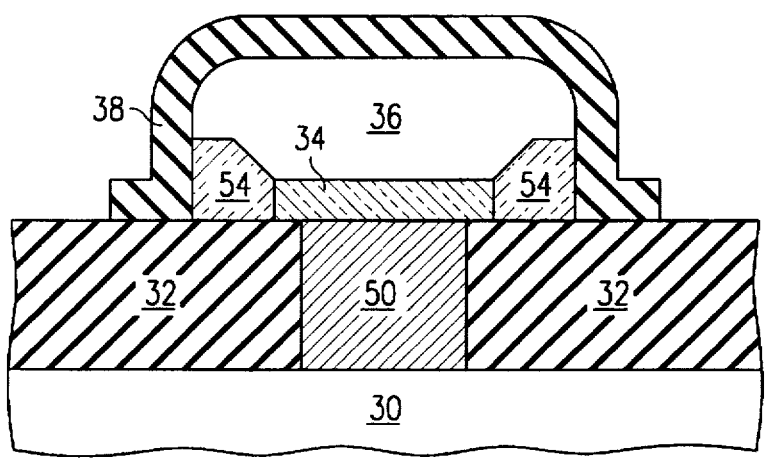
Figure 15:
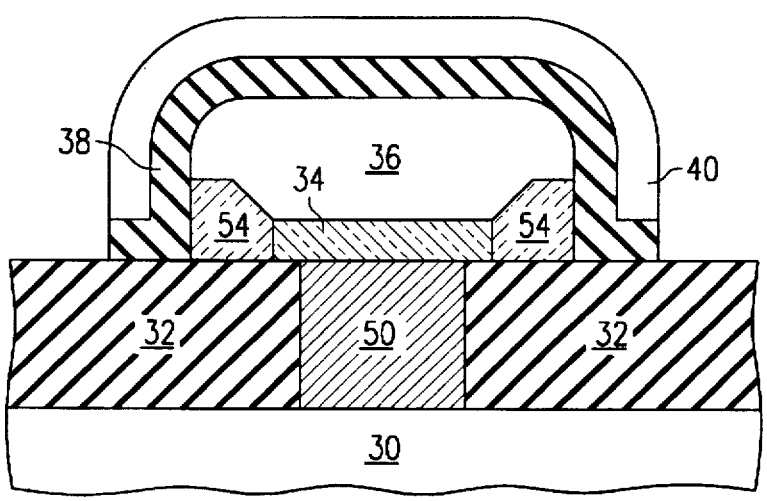

As described hereinabove, BST layer 38 is deposited by MOCVD techniques on Pt layer 36 to form the structure shown in FIG. 14. The deposition of BST layer 38 generally requires very oxidizing conditions, however Pt layer 36 will remain unoxidized, and barrier layer 34 will substantially inhibit oxygen from diffusing down to underlying materials. Finally, FIG. 15 illustrates Pt upper electrode 40 deposited on BST layer 38 to form an HDC material capacitor structure.

Figure 16:
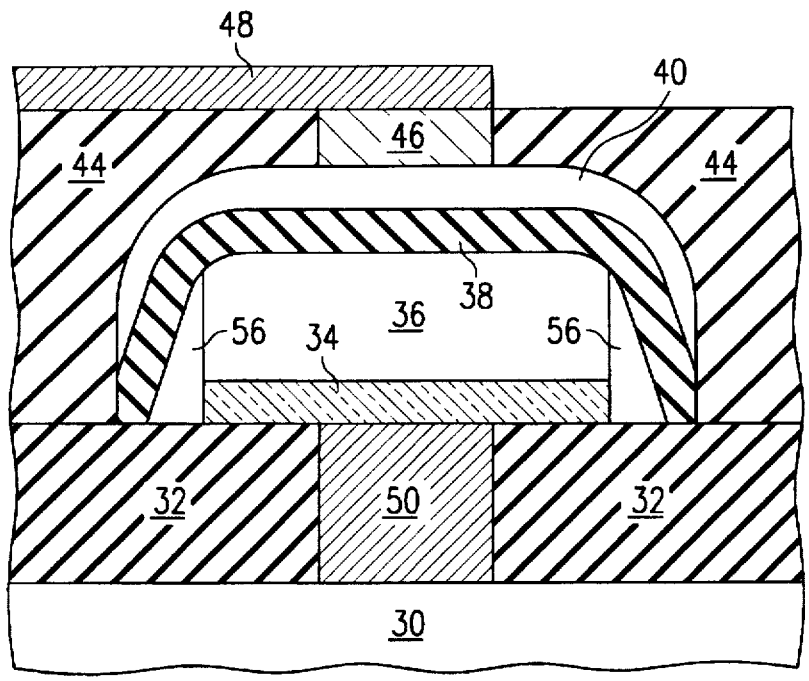
FIGS. 16–17 are cross-sectional views of various HDC material capacitors with lower electrodes comprising barrier layers.

With reference to FIG. 16, there is illustrated a high-dielectric-constant capacitor utilizing a lower electrode comprising a barrier layer. In this structure, an oxygen stable Pt sidewall 56 has been formed using isotropic deposition and anisotropic etching. Pt sidewall 56 helps to protects barrier layer 34 from direct exposure to oxygen during BST deposition.

Figure 17:
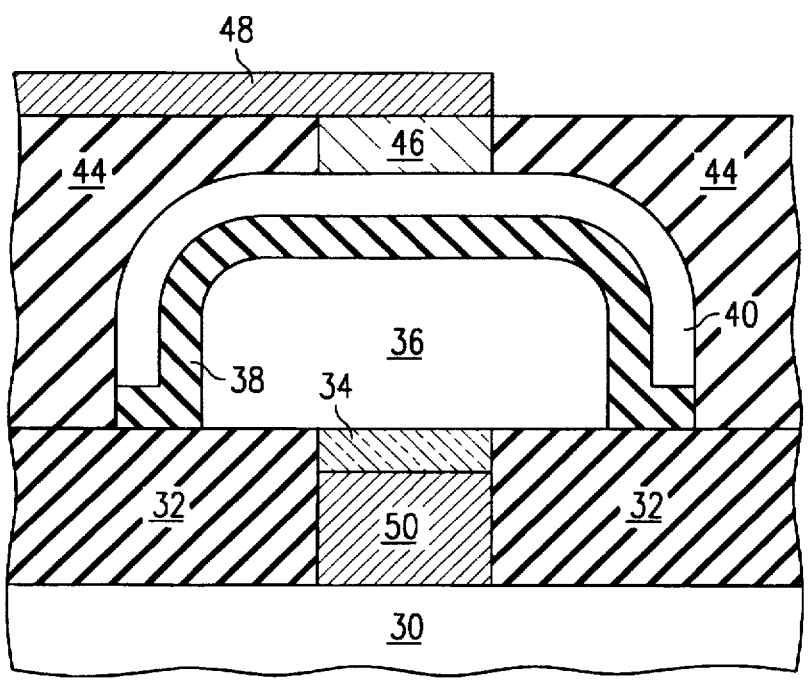

With reference to FIG. 17, there is illustrated a high-dielectric-constant capacitor utilizing a lower electrode comprising a barrier layer. In this structure, barrier layer 34 is completely surrounded laterally by SiO$_2$ layer 32, and completely covered by Pt layer 36. This structure effectively shields barrier layer 34 from direct exposure to oxygen during BST deposition without the extra process steps required to form the Pt sidewall 56 of FIG. 16.

The sole Table, below, provides an overview of some embodiments and the drawings.

TABLE

| Drawing Element | Preferred or Specific Examples | Generic Term | Other Alternate Examples |
|---|---|---|---|
| 30 | Silicon | Substrate | Other single component semiconductors (e.g. germanium, diamond) Compound semiconductors (e.g. GaAs, InP, Si/Ge, SiC) Ceramic substrates May be oxidizable layer |
| 32 | Silicon dioxide | First level insulator | Other insulators (e.g. silicon nitride) Doped insulators (e.g. BSG, PSG, BPSG) May be more than one layer (e.g. Si$_3$N$_4$ barrier over SiO$_2$) May or may not be used (i.e. first level insulator, substrate, another insulating layer or a combination thereof may be the supporting layer for the lower electrode) May contain an oxidizable layer connecting an overlying barrier layer to the underlying substrate Combinations of the above materials |
| 34 | Ti—Si—N (amorphous nitride) Ti—Al—N (exotic conductive nitride) | Barrier layer | Ternary (or greater) amorphous nitrides (e.g. Ta—Si—N, Ta—B—N, Ti—B—N) Exotic conductive nitrides (i.e. Zr nitride, Hf nitride, Y nitride, Sc nitride, La nitride and other rare earth nitrides, N deficient Al nitride, doped Al nitride, Mg nitride, Ca nitride, Sr nitride, |

TABLE-continued

| Drawing Element | Preferred or Specific Examples | Generic Term | Other Alternate Examples |
|---|---|---|---|
| | Pd—Si—N (noble-metal-insulator-alloy) | | Ba nitride) Alloys of the above exotic conductive nitrides with common Si processing materials such as TiN, GaN, Ni nitride, Co nitride, Ta nitride and W nitride (e.g. Ta—Al—N) Noble-metal-insulator-alloys (e.g. Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, Au—Si—N) May be multiple layers Combinations of the above materials |
| 36 | Platinum | Oxygen stable layer | Other noble or platinum group metals or alloys thereof (e.g. palladium, iridium, rhenium, rhodium, gold, silver) |
| 56 | | Oxygen stable sidewall | Conductive metal compounds (e.g. binary oxides: ruthenium oxide, tin oxide, indium oxide, rhenium oxide, osmium, oxide, rhodium oxide, iridium oxide; doped oxides: doped tin, indium or zinc oxide) Conductive perovskite like materials (e.g. $YBa_2Cu_3O_{7-x}$, $(La,Sr)CoO_3$, $SrRuO_3$) Combinations of the above materials Layers of the above materials |
| 38 | Barium strontium titanate | High-dielectric-constant material layer | Other perovskite, pyroelectric, ferroelectric, or high-dielectric-constant oxides (e.g. $(Ba,Sr,Ca,Pb)(Ti,Zr)O_3$, $(Pb,La)(Zr,Ti)O_3$, bismuth titanate, potassium tantalate, lead scandium tantalate, lead niobate, potassium niobate, lead zinc niobate, lead magnesium niobate, tantalum pentoxide, yttrium oxide) Donor, acceptor, or donor and acceptor doped oxides listed above Combinations of the above materials Layers of the above materials |
| 40 | Platinum | Upper electrode | Other noble or platinum group metals (e.g. palladium, ruthenium, rhodium, gold, iridium, silver) Conductive metal compounds (e.g. nitrides: titanium nitride, ruthenium nitride tin nitride, zirconium nitride, tungsten nitride; oxides: ruthenium dioxide, tin oxide, zinc oxide, doped zinc oxide, iridium oxide; silicides: titanium silicide, tantalum silicide, tungsten silicide, molybdenum silicide, nickel silicide; carbides: tantalum carbide; borides: titanium boride) Reactive metals (e.g. tantalum, titanium, molybdenum, tungsten) Other common semiconductor electrodes (e.g. aluminum, doped Si or Ge) May contain more than one layer May comprise the same types of layers used for the lower electrode, but typically in reverse order Combinations of the above materials |
| 42 | Conductive doped silicon | Conductive semiconductor material | Semiconductor devices May be oxidizable layer |
| 44 | Silicon dioxide | Second level insulator | Other insulators (e.g. silicon nitride) |
| 46 | TiN | Interlevel plug | Other reactive metal compounds (e.g. nitrides: zirconium nitride; silicides: titanium silicide, tantalum silicide, tungsten silicide, molybdenum silicide, nickel silicide, cobalt silicide; carbides: tantalum carbide; borides: titanium boride) Single component semiconductors (e.g. single- or poly-crystalline silicon, germanium) Reactive metals (e.g. tungsten, tantalum, titanium, molybdenum, titanium tungsten) Conductive carbides and borides (e.g. boron carbide) Aluminum, copper, and alloys with these elements Compound semiconductors (e.g. GaAs, InP, Si/Ge, SiC) Combinations of the above materials |
| 48 | Aluminum | Upper metallization | Other common semiconductor electrodes (e.g. silicides, TiN) Two or more layers of metal and dielectric Combinations of the above materials |
| 50 | TiN/TiSi$_2$/poly-Si | Conductive plug | Other reactive metal compounds (e.g. nitrides: zirconium-nitride; silicides: titanium silicide, tantalum silicide, tungsten silicide, molybdenum silicide, nickel silicide; carbides: tantalum carbide; borides: titanium |

TABLE-continued

| Drawing Element | Preferred or Specific Examples | Generic Term | Other Alternate Examples |
|---|---|---|---|
| | | | boride) Single component semiconductors (e.g. single- or poly-crystalline silicon, germanium) Reactive metals (e.g. tungsten, tantalum, titanium, molybdenum) Conductive carbides and borides (e.g. boron carbide) Compound semiconductors (e.g. GaAs, InP, Si/Ge, SiC) May be oxidizable layer Combinations of the above materials |
| 52 | Photoresist | Mask layer | Other semiconductor masking materials |
| 54 | Oxidized Ti—Si—N | Pre-oxidized conductive sidewall | Oxidized materials from Drawing Element 34 above Some materials may already be oxidized such as Pd—Si—O |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. Unless otherwise stated, all composition ratios or percentages are in relation to composition by atom fraction. As used herein, rare earth nitrides are defined to be nitrides of the following elements: La, Ce, Pr, Nd, Pm, Sm, Eu, Gd, Tb, Dy, Ho, Er, Tm, Yb and Lu.

Many different types of processes known in the art may be used to deposit the various layers of the novel structures. For example, processes for depositing the lower electrode materials include sputtering, reactive sputtering, sputtering as described with and without collimation and other enhancements, evaporation, and chemical or metalorganic chemical vapor deposition. Examples of processes for depositing the high-dielectric-constant material are sputtering, reactive sputtering with a metallic or oxide target, ion-beam sputtering, chemical vapor deposition, metalorganic chemical vapor deposition (with or without ions, electrons photons or plasma enhancement), sol-gel deposition, metalorganic decomposition and pulsed laser deposition. Layers that are described as alloys, compounds, mixtures, etc., are meant to be intentionally formed and substantial layers, as opposed to an unintentional partial mixture of the components of two separate layers that may be incidentally formed at the interface of those layers.

The new barrier materials in general refer to nitrides. Actually, it is generally very difficult to deposit pure nitrides. There are almost always C and O "impurities" present. These impurities are frequently essential in order for the nitride to perform its function. For example, O in TiN is known to dramatically improve the barrier properties. Therefore, the novel barrier materials will also be assumed to have C and O impurities which might improve the properties even though they are not explicitly written in their formula. These C and O impurities might even be deliberately added. The sum of C and O will be less than 30 atom % with the rest N plus the required cations. For some applications, these impurities are probably required and in that case the sum of C and O will be more than 5 atom %.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic structure comprising:
   an oxidizable layer, wherein said oxidizable layer is substantially conductive and unoxidized;
   a ternary or greater amorphous nitride layer overlying said oxidizable layer;
   an oxygen stable layer overlying said amorphous nitride layer; and
   a layer of a high-dielectric-constant material overlying said oxygen stable layer, whereby the amorphous nitride layer substantially inhibits diffusion of oxygen to the oxidizable layer.

2. The structure of claim 1, wherein said amorphous nitride layer is partially oxidized.

3. The structure of claim 1, wherein said amorphous nitride layer comprises Ti—Si—N.

4. The structure of claim 1, wherein said amorphous nitride layer is selected from the group consisting of: Ti—Si—N, Ta—Si—N, Ta—B—N, Ti—B—N, and combinations thereof.

5. The structure of 1, said structure further comprising an upper electrode overlying said high-dielectric-constant material layer.

6. The structure of claim 5, wherein said upper electrode is selected from the group consisting of: tungsten, tungsten nitride, titanium, titanium nitride, ruthenium dioxide, $YBa_2Cu_3O_{7-x}$, platinum, palladium, rhodium, gold, iridium, silver, and combinations thereof.

7. The structure of claim 1, further comprising an oxygen stable sidewall adjacent said amorphous nitride layer and said oxygen stable layer.

8. The structure of claim 1, wherein said oxidizable layer is selected from the group consisting of: tantalum, tungsten, titanium, molybdenum, titanium nitride, zirconium nitride, titanium silicide, tantalum silicide, tungsten silicide, molybdenum silicide, tantalum carbide, titanium boride, boron carbide, silicon, germanium, carbon, GaAs, and combinations thereof.

9. The structure of claim 1, wherein said high-dielectric-constant material is selected from the group consisting of: barium strontium titanate, lead zirconate titanate, lead lanthanum titanate, lead lanthanum zirconate titanate, bismuth titanate, potassium tantalate, lead scandium tantalate, lead niobate, lead zinc niobate, potassium niobate, lead magnesium niobate, and combinations thereof.

10. The structure of claim 1, wherein stable layer comprises platinum.

11. The structure of claim 1, wherein said oxygen stable layer is selected from the group consisting of: platinum, palladium, rhenium, rhodium, ruthenium oxide, tin oxide, indium oxide, rhenium oxide, osmium oxide, rhodium oxide, iridium oxide, and combinations thereof.

12. A microelectronic structure, said structure comprising:
(a) a TiN layer;
(b) a Ti—Si—N layer overlying said TiN layer;
(c) a Pt layer overlying said Ti—Si—N layer; and
(d) a high dielectric constant material layer overlying said Pt layer.

13. The structure of claim 12, further comprising an upper electrode overlying said high dielectric constant material layer.

14. The structure of claim 13, wherein said high dielectric constant material layer is barium strontium titanate.

* * * * *